United States Patent
Cheng et al.

(10) Patent No.: US 10,056,289 B1
(45) Date of Patent: Aug. 21, 2018

(54) FABRICATION OF VERTICAL TRANSPORT FIN FIELD EFFECT TRANSISTORS WITH A SELF-ALIGNED SEPARATOR AND AN ISOLATION REGION WITH AN AIR GAP

(71) Applicant: INTERNATIONAL BUSINESS MACHINES CORPORATION, Armonk, NY (US)

(72) Inventors: Kangguo Cheng, Schenectady, NY (US); Zuoguang Liu, Schenectady, NY (US); Sebastian Naczas, Albany, NY (US); Heng Wu, Altamont, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/492,745

(22) Filed: Apr. 20, 2017

(51) Int. Cl.
| | |
|---|---|
| *H01L 27/00* | (2006.01) |
| *H01L 21/764* | (2006.01) |
| *H01L 21/8238* | (2006.01) |
| *H01L 27/092* | (2006.01) |
| *H01L 29/06* | (2006.01) |
| *H01L 29/423* | (2006.01) |
| *H01L 29/786* | (2006.01) |

(52) U.S. Cl.
CPC .... *H01L 21/764* (2013.01); *H01L 21/823878* (2013.01); *H01L 21/823885* (2013.01); *H01L 27/092* (2013.01); *H01L 29/0649* (2013.01); *H01L 29/42392* (2013.01); *H01L 29/78642* (2013.01); *H01L 29/78696* (2013.01)

(58) Field of Classification Search
CPC .......... H01L 21/764; H01L 21/823878; H01L 21/823885; H01L 29/0649; H01L 29/42392; H01L 29/78642; H01L 29/78696
See application file for complete search history.

(56) References Cited

U.S. PATENT DOCUMENTS

| | | |
|---|---|---|
| 7,389,438 B2 | 6/2008 | Watts, Jr. |
| 8,502,316 B2 | 8/2013 | Fung et al. |
| 9,293,362 B2 | 3/2016 | Lee et al. |
| 9,368,572 B1 | 6/2016 | Cheng et al. |
| 2011/0215396 A1 | 9/2011 | Tang et al. |
| 2016/0172250 A1 | 6/2016 | Shue et al. |

FOREIGN PATENT DOCUMENTS

JP 5374546 B2 12/2013

*Primary Examiner* — Matthew Reames
(74) *Attorney, Agent, or Firm* — Tutunjian & Bitetto, P.C.; Vazken Alexanian (57) ABSTRACT

A method of forming a vertical transport fin field effect transistor with self-aligned dielectric separators, including, forming a bottom source/drain region on a substrate, forming at least two vertical fins on the bottom source/drain region, forming a protective spacer on the at least two vertical fins, forming a sacrificial liner on the protective spacer, forming an isolation channel in the bottom source/drain region and substrate between two of the at least two vertical fins, forming an insulating plug in the isolation channel, wherein the insulating plug has a pinch-off void within the isolation channel, and forming the dielectric separator on the insulating plug.

14 Claims, 8 Drawing Sheets

FABRICATION OF VERTICAL TRANSPORT FIN FIELD EFFECT TRANSISTORS WITH A SELF-ALIGNED SEPARATOR AND AN ISOLATION REGION WITH AN AIR GAP

BACKGROUND

Technical Field

The present invention generally relates to utilizing two adjacent vertical fins to align a deep isolation region without having to increase the distance between the vertical fins, and more particularly to using a protective spacer and sacrificial liner on the vertical fins to align the deep isolation region and an insulating plug.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (nFET) or a p-type FET (pFET) can be formed. An nFET and a pFET can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming a vertical transport fin field effect transistor with self-aligned dielectric separators is provided. The method includes forming a bottom source/drain region on a substrate, and forming at least two vertical fins on the bottom source/drain region. The method further includes forming a protective spacer on the at least two vertical fins, and forming a sacrificial liner on the protective spacer. The method further includes forming an isolation channel in the bottom source/drain region and substrate between two of the at least two vertical fins, and forming an insulating plug in the isolation channel, wherein the insulating plug has a pinch-off void within the isolation channel, and forming the dielectric separator on the insulating plug.

In accordance with another embodiment of the present invention, a method of forming a vertical transport fin field effect transistor with self-aligned dielectric separators is provided. The method includes forming at least two vertical fins on a substrate, and forming a protective spacer on the at least two vertical fins. The method further includes forming a sacrificial liner on the protective spacer, and forming an isolation channel in the substrate between two of the at least two vertical fins. The method further includes forming an insulating plug in the isolation channel, wherein the insulating plug has a pinch-off void within the isolation channel, and the insulating plug and the protective spacer are the same material. The method further includes forming the dielectric separator on the insulating plug, and removing a portion of the insulating plug on the dielectric separator, and a portion of the protective spacer on the two of the at least two vertical fins.

In accordance with yet another embodiment of the present invention, a vertical transport fin field effect transistor with self-aligned dielectric separators is provided. The vertical transport fin field effect transistor includes a bottom source/drain region on a substrate, and at least two vertical fins on the bottom source/drain region. The vertical transport fin field effect transistor further includes an isolation channel in the bottom source/drain region and substrate between two of the at least two vertical fins, and an insulating plug in the isolation channel, wherein the insulating plug has a pinch-off void within the isolation channel. The vertical transport fin field effect transistor further includes the dielectric separator on the insulating plug.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to utilizing two adjacent vertical fins to align a deep isolation region without having to increase the distance between the vertical fins or performing a fin-cut (i.e., within one fin spacing). The vertical fins can be formed with a consistent fin pitch through, for example, a sidewall image transfer (SIT) process, and the deep isolation region properly aligned between two vertical fins without additional processing steps, fin-cut steps, or mask alignments. The width of the deep isolation region can be sufficiently maintained, and increased parasitic capacitances can be reduced or avoided.

Embodiments of the present invention also relate to using a protective spacer and sacrificial liner on the vertical fins to align the deep isolation region and an insulating plug to physically separate and electrically isolate adjacent vertical fin field effect devices (VT FinFETs).

Embodiments of the present invention also relate to forming a void space in the insulating plug by pinching off the opening of the isolation channel using a non-conformal deposition process. The pinch-off void in the isolation channel can provide a lower dielectric value for the deep isolation region.

Embodiments of the present invention also relate to reducing the parasitic capacitance by forming an air gap (also referred to as a void space) in the deep isolation region by utilizing a deposition process that occludes the proximal opening of the isolation channel before an insulating, dielectric material can fully fill the isolation channel. Conformal depositions are, therefore, avoided to prevent a layer-by-layer build up that would fill the isolation channel.

Exemplary applications/uses to which the present invention can be applied include, but are not limited to: logic devices (e.g., gates, flip-flops) and memory devices (e.g., SRAM, DRAM).

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. As further described herein, the source and drain also can be different due to fabrication with different materials providing different electrical properties. In addition, the role of source and drain for an active device can in some instances be reversed, so a previously indicated drain may instead be a source and vice versa. Reference to a source/drain is, therefore, intended to encompass the broadest reasonable scope of the term.

Figure 1:
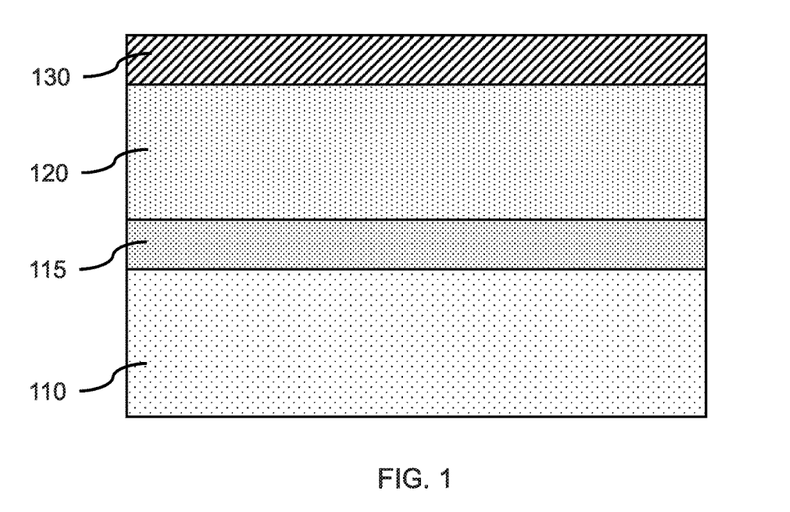
FIG. 1 is a cross-sectional side view showing a bottom source/drain region of a substrate, a fin layer on the bottom source/drain region, and fin template layer on the fin layer, in accordance with an embodiment of the present invention.

Referring now to the drawings in which like numerals represent the same or similar elements and initially to FIG. 1, a cross-sectional side view of a bottom source/drain region of a substrate, a fin layer on the bottom source/drain region, and fin template layer on the fin layer, in accordance with an embodiment of the present invention, is shown.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. Other semiconductor devices and features, such as shallow trench isolation (STI) regions, may already be formed on the substrate.

In one or more embodiments, a bottom source/drain region 115 can be formed at the surface of the substrate, where the bottom source/drain region 115 can be formed on the surface of the substrate or implanted into a surface region of the substrate. The bottom source/drain region 115 can be epitaxially grown on the surface of the substrate 110, where the substrate surface can have a predetermined crystal face (e.g., (100)). The bottom source/drain region 115 can be a doped layer that includes dopant species suitable to form a p-type bottom source/drain region 115 (e.g., boron, gallium, and indium), or dopant species suitable to form an n-type bottom source/drain region 115 (e.g., phosphorus, arsenic, and antimony).

In one or more embodiments, a fin layer 120 can be formed on the bottom source/drain region 115. The fin layer 120 can be formed by epitaxial growth on the bottom source/drain region 115. In one or more embodiments, the fin layer 120 can be single crystal silicon (Si) or single crystal silicon-germanium (SiGe) with the same crystal orientation as the bottom source/drain region 115 on which the fin layer 120 is grown. In various embodiments, the fin layer 120 can be a semiconductor material, which can be an intrinsic semiconductor material (e.g., silicon (Si)).

In one or more embodiments, a fin template layer 130 can be formed on the fin layer 120, where the fin template layer 130 can be a hardmask. The fin template layer 130 can be blanket deposited, for example, by chemical vapor deposition (CVD) or plasma enhanced chemical vapor deposition (PECVD) on the exposed surface of the fin layer 120.

Figure 2:
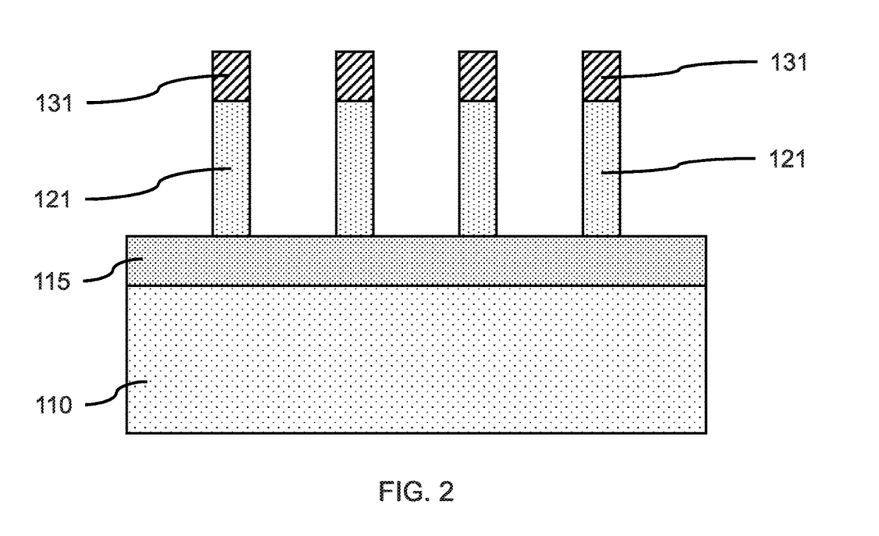
FIG. 2 is a cross-sectional side view showing fin templates on a plurality of vertical fins, in accordance with an embodiment of the present invention.

FIG. 2 is a cross-sectional side view showing fin templates on a plurality of vertical fins, in accordance with an embodiment of the present invention.

In one or more embodiments, fin templates 121 can be formed on the fin layer 120. The fin template layer 130 can be patterned by such processes to form one or more fin templates 131, where the fin templates 131 can be used to mask portions of the underlying fin layer 120. In various embodiments, portions of the fin layer 120 exposed between fin templates 131 can be removed, for example, by a directional selective etch, such as a reactive ion etch (RIE), to form one or more vertical fins 121.

In various embodiments, a plurality of vertical fins 121 can be formed by a sidewall image transfer (SIT) process, self-aligned double patterning (SADP) process, or self-aligned quadruple patterning (SAQP) process, to provide a tight pitch between vertical fins 121. In various embodiments, a direct print can be used to provide the fin templates 131 from the fin template layer 130. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. The vertical fins 121 can have a uniform spacing, as determined by the fabrication process. In various embodiments, two vertical fins can be separated by a fin pitch in the range of about 15 nm to about 50 nm, or about 15 nm to about 35 nm.

Figure 3:
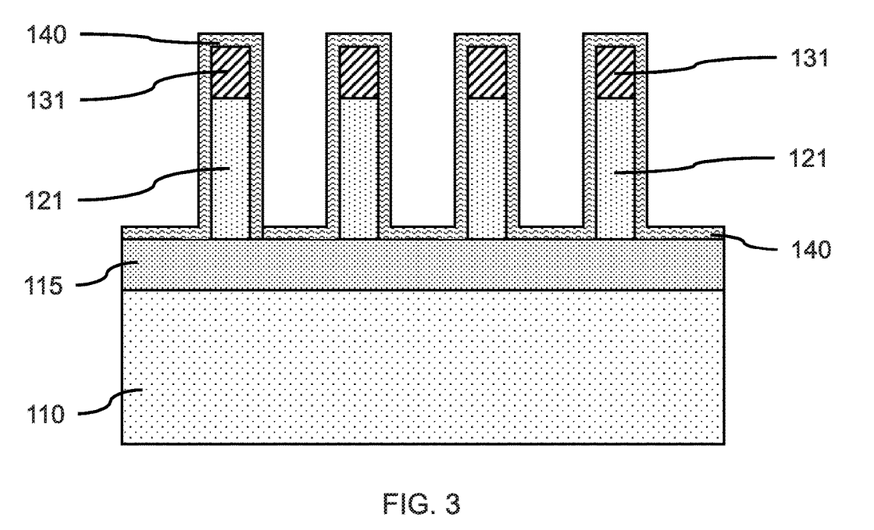
FIG. 3 is a cross-sectional side view showing a protective spacer on the fin templates and vertical fins, in accordance with an embodiment of the present invention.

FIG. 3 is a cross-sectional side view showing a protective spacer on the fin templates and vertical fins, in accordance with an embodiment of the present invention.

In one or more embodiments, a protective spacer 140 can be formed on the fin templates 131, vertical fins 121, and substrate 110. The protective spacer 140 can be formed by a conformal deposition (e.g., by atomic layer deposition (ALD), plasma enhanced atomic layer deposition (PEALD)) to control the thickness of the protective spacer 140. The protective spacer 140 can be silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), or a combination thereof.

In various embodiments, the protective spacer 140 can have a thickness in the range of about 1 nm to about 5 nm.

Figure 4:
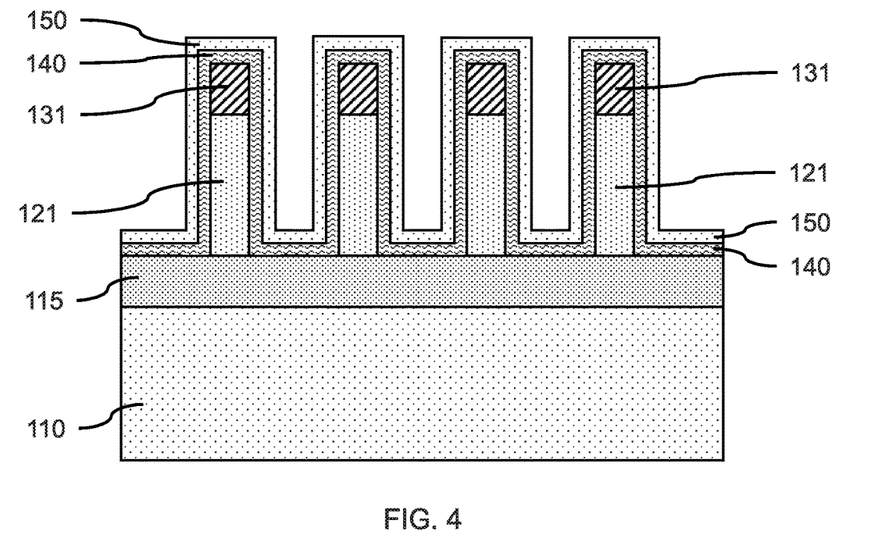
FIG. 4 is a cross-sectional side view showing a sacrificial liner on the protective spacer, in accordance with an embodiment of the present invention.

FIG. 4 is a cross-sectional side view showing a sacrificial liner on the protective spacer, in accordance with an embodiment of the present invention.

In one or more embodiments, a sacrificial liner 150 can be formed on the protective spacer 140, where the sacrificial liner 150 can be formed by a conformal deposition. The sacrificial liner 150 can be can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof. The sacrificial liner 150 can be selectively etchable over the protective spacer 140.

In various embodiments, the sacrificial liner 150 can have a thickness in the range of about 1 nm to about 10 nm. The sacrificial liner 150 can be used to control the width of an isolation channel and a subsequently formed dielectric separator. The sacrificial liner 150 thickness and protective spacer 140 thickness can determine the spacing between a dielectric separator and vertical fin sidewall for subsequent formation of gate structures on portions of adjacent FinFETs.

Figure 5:
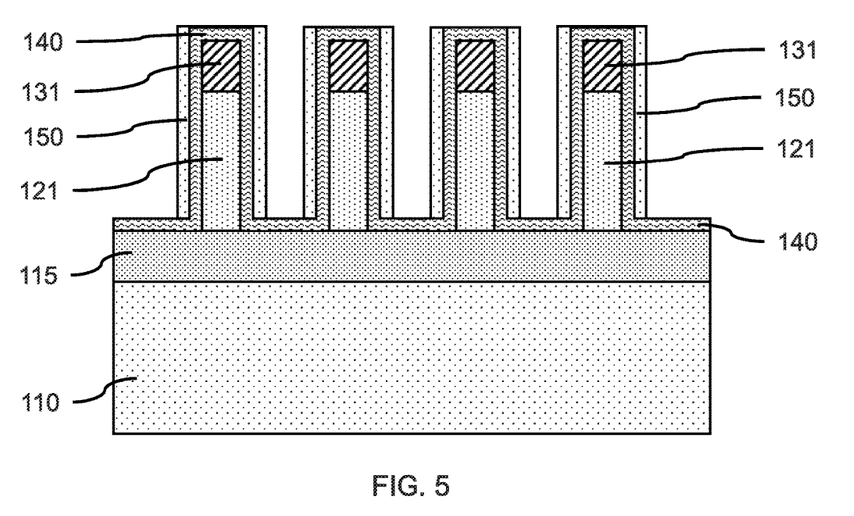
FIG. 5 is a cross-sectional side view showing exposed horizontal surfaces of the protective spacer, in accordance with an embodiment of the present invention.

FIG. 5 is a cross-sectional side view showing exposed horizontal surfaces of the protective spacer, in accordance with an embodiment of the present invention.

In one or more embodiments, the sacrificial liner 150 can be removed from the horizontal surfaces to expose the protective spacer 140. A directional etch can be used to remove the sacrificial liner material from surfaces approximately perpendicular to the ion beam, while the sacrificial liner 150 remains on the vertical surfaces. The protective spacer 140 can act as an etch stop to protect the underlying bottom source/drain region 115.

Figure 6:
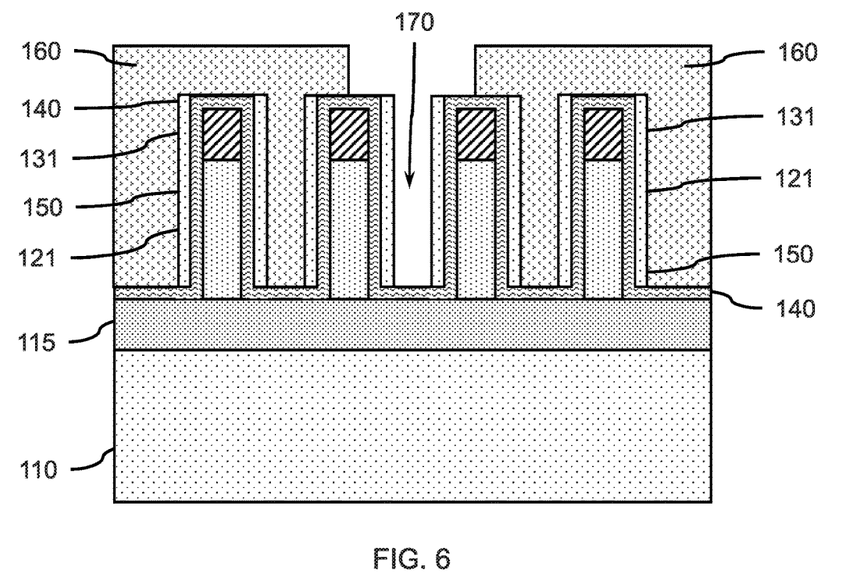
FIG. 6 is a cross-sectional side view showing a trench in a fill layer exposing the protective spacer, in accordance with an embodiment of the present invention.

FIG. 6 is a cross-sectional side view showing a trench in a fill layer exposing the protective spacer, in accordance with an embodiment of the present invention.

In one or more embodiments, a fill layer 160 can be formed on the sacrificial liner 150 and protective spacer 140, where the fill layer 160 can fill in the spaces between the vertical fins 121 and fin templates 131. The fill layer 160 can be blanket deposited and a CMP used to provide a flat, uniform surface. The fill layer 160 can be a flowable oxide or suitable polymeric material.

In one or more embodiments, a portion of the fill layer 160 can be removed from between two vertical fins 121 to form a trench 170 that exposes the underlying protective spacer 140. The fill layer 160 can be removed by patterning and developing a lithography mask and using a selective, directional etch to remove the exposed fill layer material. The sacrificial liner 150 can be exposed on the vertical side walls of the trench 170, and the protective spacer 140 can be exposed at the bottom of the trench 170 and on the horizontal surfaces of the fin templates 131. The thickness of the sacrificial liner can define a distance between the upper edge and sidewall of the trench 170 to the side walls of the protective spacer 140.

Figure 7:
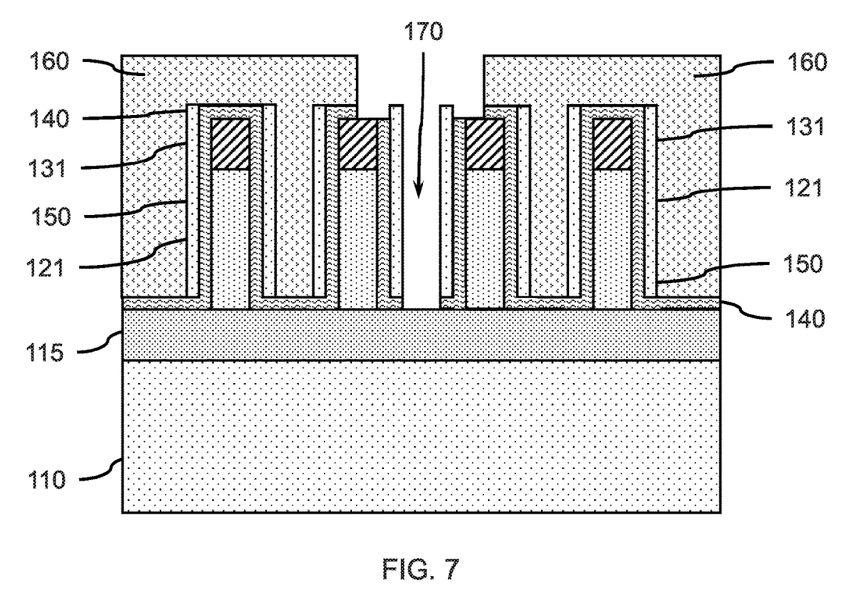
FIG. 7 is a cross-sectional side view showing an opening formed in the protective spacer exposing the underlying substrate, in accordance with an embodiment of the present invention.

FIG. 7 is a cross-sectional side view showing an opening formed in the protective spacer exposing the underlying substrate, in accordance with an embodiment of the present invention.

In one or more embodiments, a directional etch can be used to remove the exposed portion of the protective spacer 140 on the fin templates 131 and form an opening in the protective spacer 140 at the bottom of the trench 170.

Figure 8:
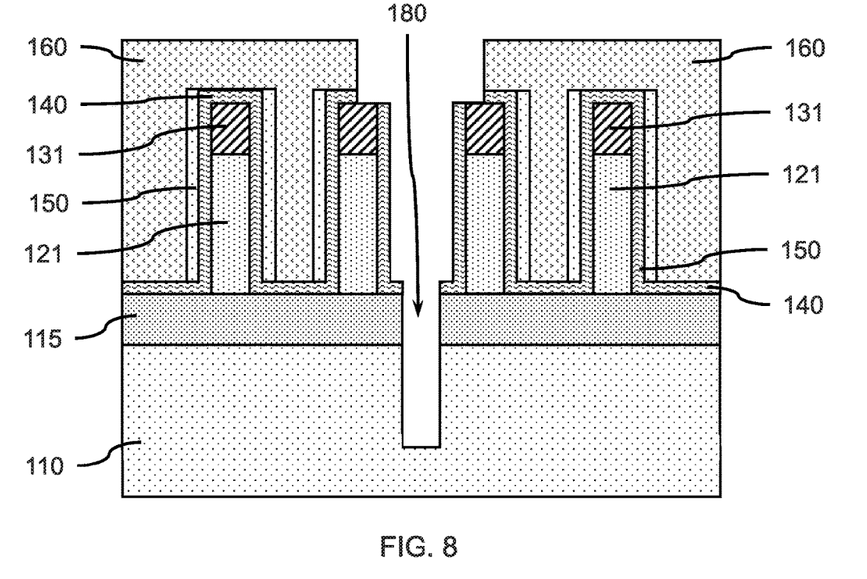
FIG. 8 is a cross-sectional side view showing removal of the exposed sacrificial liner, and an isolation channel formed in the bottom source/drain layer and substrate, in accordance with an embodiment of the present invention.

FIG. 8 is a cross-sectional side view showing removal of the exposed sacrificial liner, and an isolation channel formed in the bottom source/drain layer and substrate, in accordance with an embodiment of the present invention.

In one or more embodiments, an isolation channel 180 can be formed in the bottom source/drain region 115 and substrate 110 using a selective, directional etch. The isolation channel 180 can separate the bottom source/drain region 115 into two sections, and extend into the substrate 110.

Figure 9:
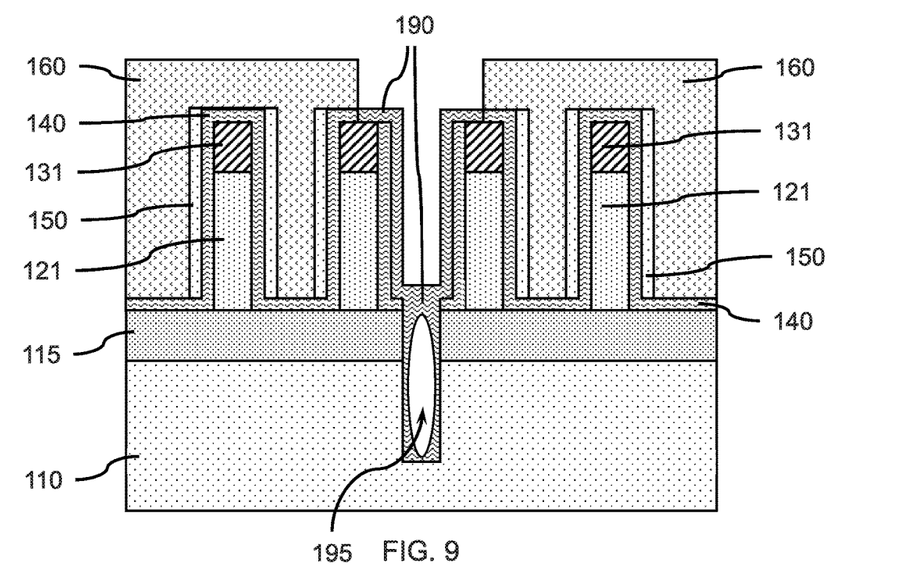
FIG. 9 is a cross-sectional side view showing an insulating plug and pinch-off void in the isolation channel to form a deep isolation region, in accordance with an embodiment of the present invention.

FIG. 9 is a cross-sectional side view showing an insulating plug and pinch-off void in the isolation channel to form a deep isolation region, in accordance with an embodiment of the present invention.

In one or more embodiments, an insulating plug 190 can be formed in the isolation channel 180 and on the protective spacers 140. The insulating plug 190 can be formed by chemical vapor deposition (CVD) or plasma enhanced chemical vapor deposition (PECVD) to occlude the opening in the isolation channel 180 at the top surface of the bottom source/drain region 115 to form a pinch-off void 195. A CVD or PECVD deposition can pinch-off the opening before the entire isolation channel 180 is filled with an insulating, dielectric material. The insulating plug 190 can include a layer of the insulating, dielectric material on the exposed vertical surfaces and top surfaces of the fin templates 131. The pinch-off void 195 can contain air that can form an air gap between components of adjacent fin field effect transistors (FinFETs). The insulating plug 190 and pinch-off void 195 can provide a lower dielectric constant between the adjacent FinFETs to reduce parasitic capacitances.

In one or more embodiments, the insulating plug 190 can be silicon oxide (SiO). The insulating plug 190 can be the same material as the protective spacer 140 to allow both a portion of the insulating plug 190 and a portion of the protective spacer 140 to be removed at the same time.

Figure 10:
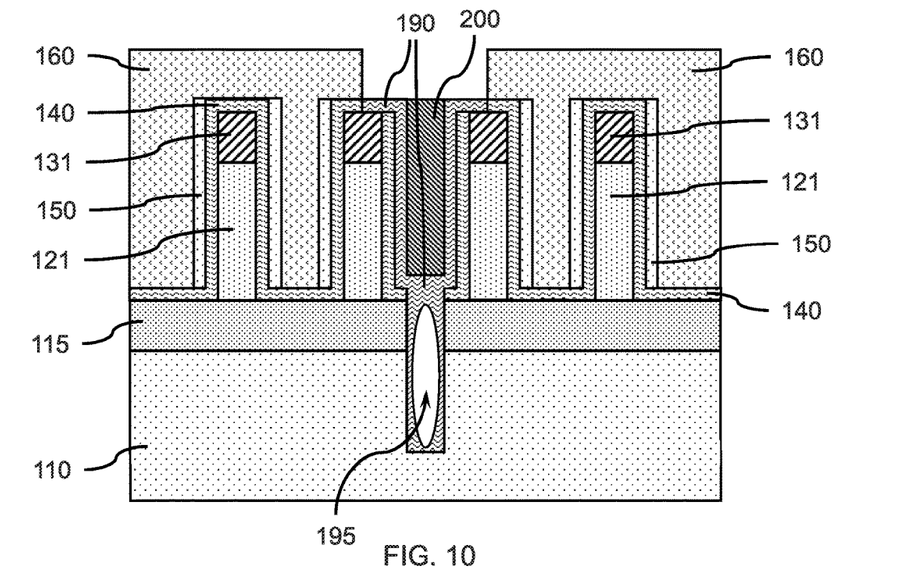
FIG. 10 is a cross-sectional side view showing a self-aligned dielectric separator on the insulating plug, in accordance with an embodiment of the present invention.

In one or more embodiments, a dielectric separator 200 can be formed on the insulating plug 195, where the dielectric separator 200 can physically and electrically separate adjacent vertical fins 121. The dielectric separator 200 can be silicon oxide (SiO), a low-k dielectric, or a combination thereof. The dielectric separator 200 can electrically insulate adjacent gate structures on the vertical fins 121. The dielectric separator can have a width in the range of about 5 nm to about 40 nm, or in the range of about 10 nm to about 30 nm.

Figure 11:
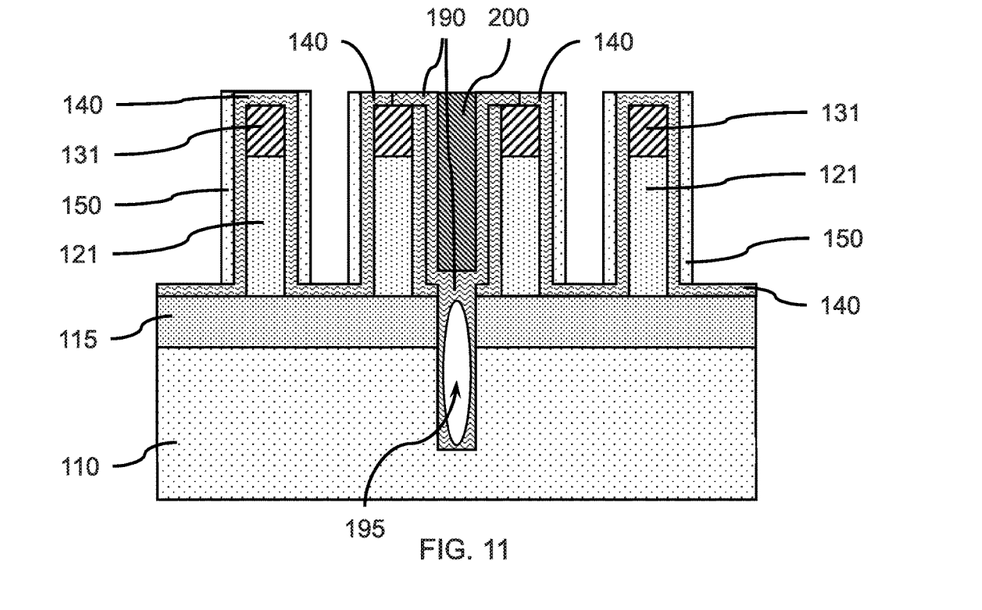
FIG. 11 is a cross-sectional side view showing an exposed sacrificial liner after removing the fill layer, in accordance with an embodiment of the present invention.

FIG. 11 is a cross-sectional side view showing an exposed sacrificial liner after removing the fill layer, in accordance with an embodiment of the present invention.

In one or more embodiments, the remaining fill layer 160 can be removed from the vertical fins 121, where the fill layer 160 can be removed using a selective etch.

Figure 12:
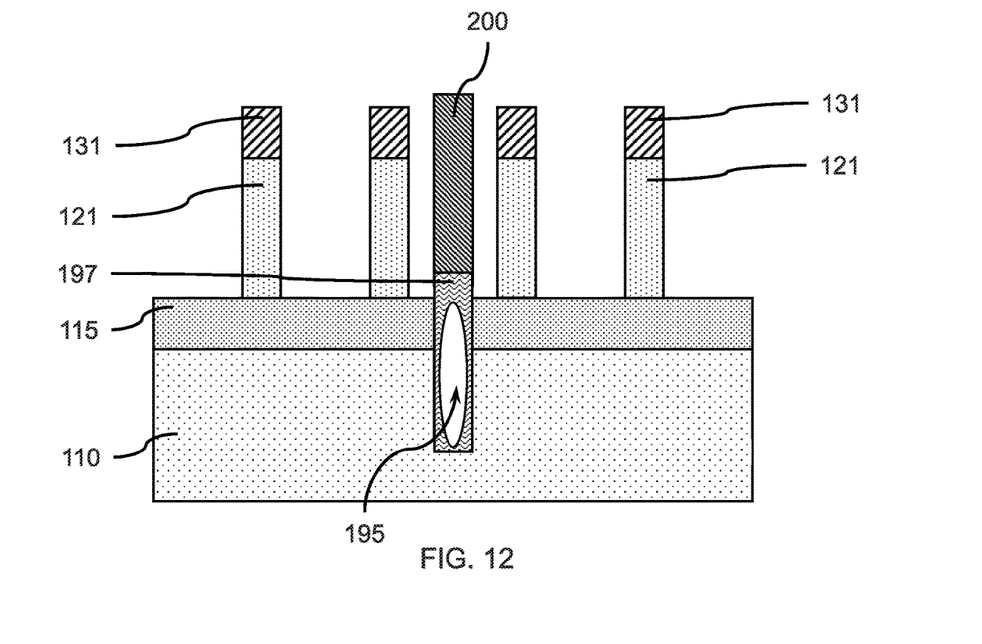
FIG. 12 is a cross-sectional side view showing exposed vertical fins and fin templates after removing the protective spacer, in accordance with an embodiment of the present invention.

FIG. 12 is a cross-sectional side view showing exposed vertical fins and fin templates after removing the protective spacer, in accordance with an embodiment of the present invention.

In one or more embodiments, an upper portion of the insulating plug 190 on the side walls of the dielectric separator 200 and protective spacer 140 can be removed to expose the side walls of the dielectric separator 200. The insulating plug 190 and protective spacer 140 can be removed at the same time using a selective etch, where the insulating plug 190 and protective spacer 140 are the same material (e.g., SiO). An insulating cap 197 can remain between the bottom surface of the dielectric separator 200 and the top surface of the bottom source/drain region 115, where the dielectric separator 200 masks the underlying portion of the insulating plug 190. The protective spacer 140 can be removed from the exposed surfaces of the vertical fins 121 and fin templates 131 using an isotropic etch.

Figure 13:
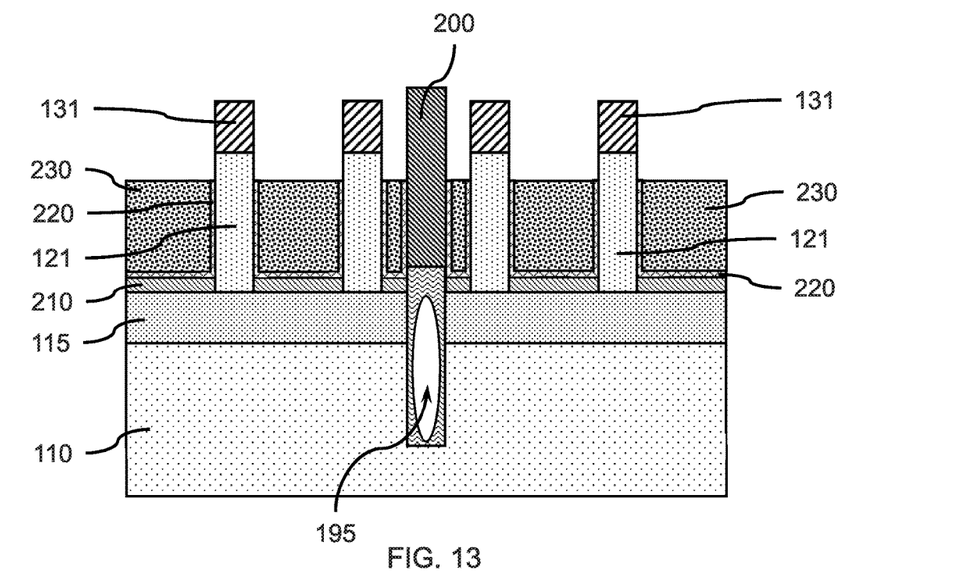
FIG. 13 is a cross-sectional side view showing gate structures formed on the vertical fins and a bottom spacer, in accordance with an embodiment of the present invention.

FIG. 13 is a cross-sectional side view showing gate structures formed on the vertical fins and a bottom spacer, in accordance with an embodiment of the present invention.

In one or more embodiments, a bottom spacer 210 can be formed on the exposed surfaces of the bottom source/drain region 115. The bottom spacer 210 can be an insulating, dielectric material that physically and electrically separates the bottom source/drain region 115 from a subsequently formed gate structure. The bottom spacer 210 can be silicon nitride (SiN).

In one or more embodiments, gate structures can be formed on the vertical fins 121 and a bottom spacer 210. The gate structures can include gate dielectric layers 220 and a conductive gate electrode 230 including a conductive gate fill and optionally a work function layer. The gate dielectric layer 220 can be formed on the exposed surfaces of the vertical fins 121, fin templates 131, and bottom spacer 210. A work function layer can be formed on the gate dielectric layer 220. A conductive gate fill can be formed on the gate dielectric layer 220 or optional work function layer. The conductive gate fill, work function layer, and gate dielectric layer 220 can be conformally deposited and etched back to form the gate structure on a portion of the vertical fins 121.

The gate dielectric layer 220 can be silicon oxide (SiO), silicon nitride (SiN), a high-k dielectric material, or a combination thereof. The work function layer can be a suitable metal nitride or metal carbide, or a stack of suitable layers.

A gate structure can be formed between the dielectric separator 200 and the adjacent vertical fins 121, where the gate dielectric layer 220 and work function layer can be conformally deposited on the exposed surfaces.

Figure 14:
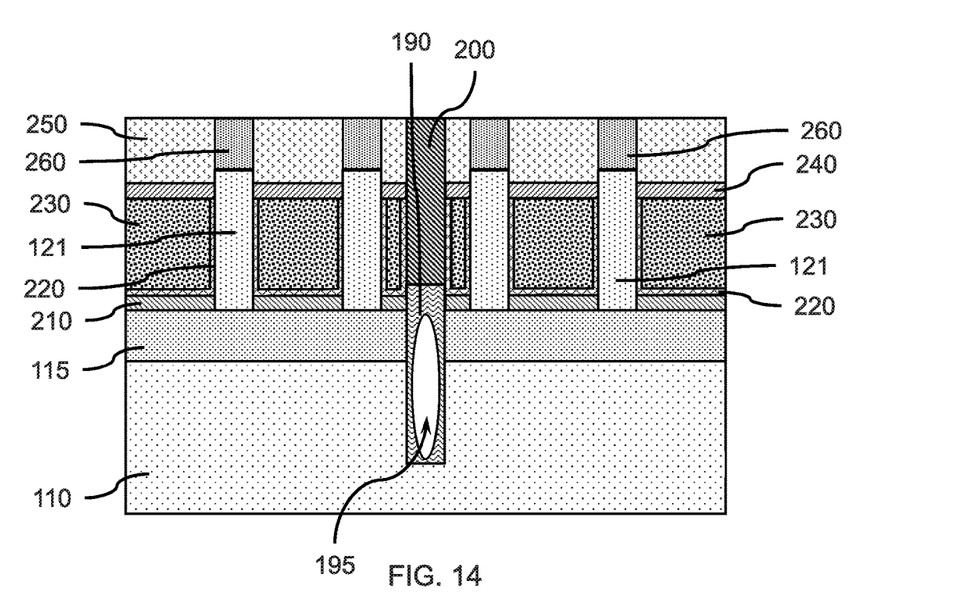
FIG. 14 is a cross-sectional side view showing a top spacer on the gate structures and top source/drains on the vertical fins, in accordance with an embodiment of the present invention.

FIG. 14 is a cross-sectional side view showing a top spacer on the gate structures and top source/drains on the vertical fins, in accordance with an embodiment of the present invention.

In one or more embodiments, a top spacer 240 can be formed on the gate structures and the vertical fins 121. The top spacer 240 can be directionally deposited and etched back to have a predetermined thickness. The top spacer 240 can be an insulating dielectric material, for example, silicon oxide (SiO).

In one or more embodiments, an interlayer dielectric (ILD) layer 250 can be formed on the top spacer layer 240 and fin templates 131. A CMP can be used to reduce the height of the ILD layer 250 and expose the top surface of the fin templates 131. The fin templates 131 can be removed by a selective etch to expose the top surfaces of the vertical fins 121.

In one or more embodiments, top source/drains 260 can be formed on the top surfaces of the vertical fins 121, where the top source/drains 260 can be epitaxially grown on the vertical fins. Electrical contacts can be formed to the gate structures and source/drains to form vertical transport fin field effect transistors (VT FinFETs).

Figure 15:
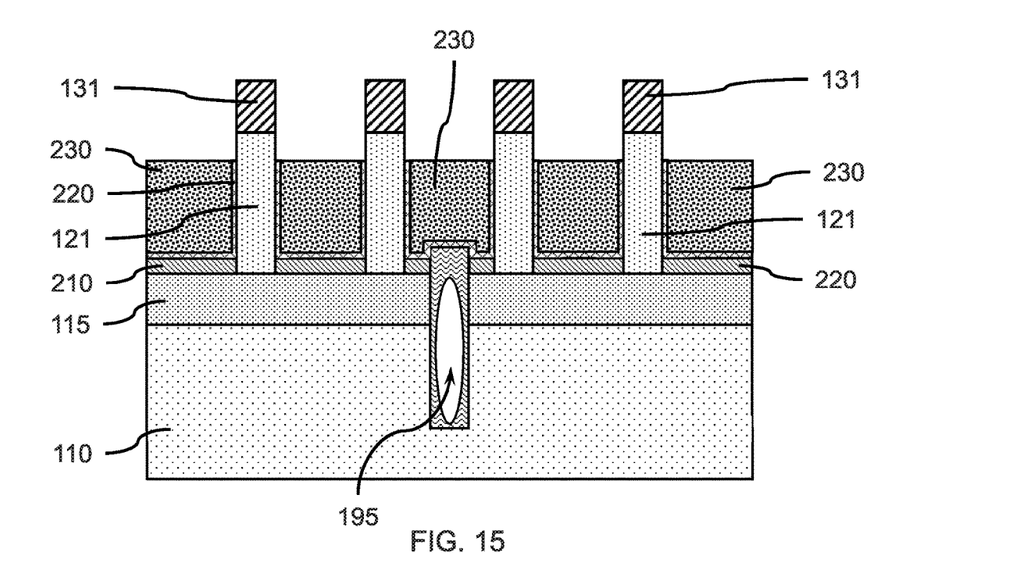
FIG. 15 is a cross-sectional side view showing shared gate structures formed on the vertical fins and a bottom spacer without a dielectric separator on the insulating plug, in accordance with an embodiment of the present invention.

FIG. 15 is a cross-sectional side view showing shared gate structures formed on the vertical fins and a bottom spacer without a dielectric separator on the insulating plug, in accordance with an embodiment of the present invention.

In another embodiment, the dielectric separator can be removed using a selective, directional etch, before the gate structures are formed. The gate dielectric layer 220 can be formed on the exposed surfaces of the insulating cap 197 and insulating plug 190 which can include the pinch-off void 195. A work function layer can be formed on the gate dielectric layer 220. A conductive gate fill can be formed on the gate dielectric layer 220 or optional work function layer, and form the gate structure on two adjacent vertical fins 121 without the interposing dielectric separator 200.

Figure 16:
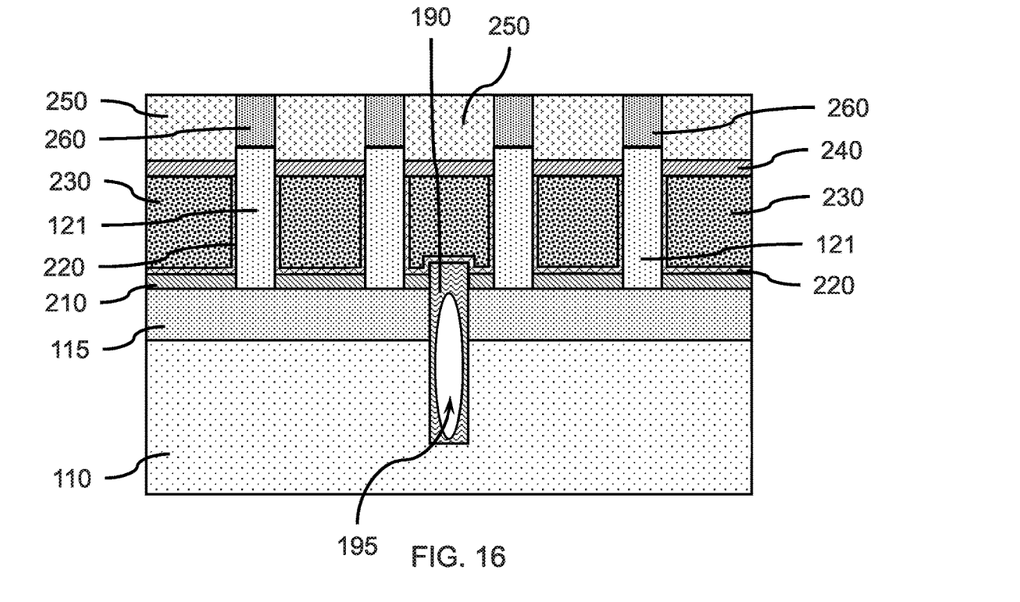
FIG. 16 is a cross-sectional side view showing a top spacer on the gate structures without a dielectric separator, and top source/drains on the vertical fins, in accordance with an embodiment of the present invention.

FIG. 16 is a cross-sectional side view showing a top spacer on the gate structures without a dielectric separator, and top source/drains on the vertical fins, in accordance with an embodiment of the present invention.

A top spacer 240 can be formed on the gate structures and the vertical fins 121, and an ILD layer 250 can be formed on the top spacer layer 240. Top source/drains 260 can be formed on the top surfaces of the vertical fins 121.

In various embodiments, a dielectric separator 200 may be between a predetermined subset of vertical fins 121, whereas a gate structure may be shared by a different subset of vertical fins 121.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a." "an" and "the" are intended to include the plural forms as well, unless the context clearly indicates otherwise. It will be further understood that the terms "comprises." "comprising." "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor with self-aligned dielectric separators, comprising:
   forming a bottom source/drain region on a substrate;
   forming at least two vertical fins on the bottom source/drain region;
   forming a protective spacer on the at least two vertical fins;
   forming a sacrificial liner on the protective spacer;
   forming an isolation channel in the bottom source/drain region and substrate between two of the at least two vertical fins;
   forming an insulating plug in the isolation channel, wherein the insulating plug has a pinch-off void within the isolation channel; and
   forming the dielectric separator on the insulating plug.

2. The method of claim 1, wherein the protective spacer and the insulating plug are silicon oxide.

3. The method of claim 1, wherein the insulating plug is formed by a non-conformal deposition process.

4. The method of claim 3, wherein the non-conformal deposition process is chemical vapor deposition or plasma enhanced chemical vapor deposition.

5. The method of claim 1, further comprising, removing a portion of the insulating plug on the dielectric separator, and a portion of the protective spacer on the two of the at least two vertical fins.

6. The method of claim 5, further comprising, forming a bottom spacer on the bottom source/drain region, and a gate dielectric layer on the bottom spacer, the two of the at least two vertical fins, and the dielectric separator.

7. The method of claim 1, wherein the two of the at least two vertical fins are separated by a fin pitch in the range of about 15 nm to about 50 nm.

8. The method of claim 7, wherein the dielectric separator has a width in the range of about 5 nm to about 40 nm.

9. The method of claim 7, wherein the dielectric separator is a silicon oxide, a low-k dielectric, or a combination thereof.

10. A method of forming a vertical transport fin field effect transistor with self-aligned dielectric separators, comprising:
    forming at least two vertical fins on a substrate;
    forming a protective spacer on the at least two vertical fins;
    forming a sacrificial liner on the protective spacer;
    forming an isolation channel in the substrate between two of the at least two vertical fins;
    forming an insulating plug in the isolation channel, wherein the insulating plug has a pinch-off void within the isolation channel, and the insulating plug and the protective spacer are the same material;
    forming the dielectric separator on the insulating plug; and
    removing a portion of the insulating plug on the dielectric separator, and a portion of the protective spacer on the two of the at least two vertical fins.

11. The method of claim 10, wherein the sacrificial liner has a thickness in the range of about 1 nm to about 10 nm.

12. The method of claim 10, wherein the protective spacer has a thickness in the range of about 1 nm to about 5 nm.

13. The method of claim 10, further comprising, forming a bottom spacer on the substrate, and a gate dielectric layer on the bottom spacer, the two of the at least two vertical fins, and the dielectric separator.

14. The method of claim 13, wherein the pinch-off void within the isolation channel reduces the dielectric constant of the insulating plug.

* * * * *